(12) United States Patent
Sometani et al.

(10) Patent No.: US 10,094,867 B2
(45) Date of Patent: Oct. 9, 2018

(54) METHOD OF EVALUATING SEMICONDUCTOR DEVICE AND APPARATUS FOR EVALUATING SEMICONDUCTOR DEVICE

(71) Applicants: FUJI ELECTRIC CO., LTD., Kawasaki-shi, Kanagawa (JP); NATIONAL INSTITUTE OF ADVANCED INDUSTRIAL SCIENCE AND TECHNOLOGY, Tokyo (JP)

(72) Inventors: Mitsuru Sometani, Tsukuba (JP); Manabu Takei, Shiojiri (JP); Shinsuke Harada, Tsukuba (JP)

(73) Assignees: FUJI ELECTRIC CO., LTD., Kawasaki-Shi, Kanagawa (JP); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 15/247,165

(22) Filed: Aug. 25, 2016

(65) Prior Publication Data
US 2017/0108545 A1    Apr. 20, 2017

(30) Foreign Application Priority Data
Oct. 16, 2015   (JP) .................................. 2015-204678

(51) Int. Cl.
*G01R 31/26*   (2014.01)
*H01L 21/66*   (2006.01)
(Continued)

(52) U.S. Cl.
CPC ......... *G01R 31/26* (2013.01); *G01R 31/2621* (2013.01); *H01L 22/34* (2013.01);
(Continued)

(58) Field of Classification Search
None
See application file for complete search history.

(56) References Cited

U.S. PATENT DOCUMENTS

| | | | |
|---|---|---|---|
| 2011/0017998 A1* | 1/2011 | Nakano | H01L 21/046 257/66 |
| 2012/0187975 A1* | 7/2012 | Koh | G01R 31/2621 324/762.01 |

(Continued)

FOREIGN PATENT DOCUMENTS

JP       H08-5706 A      1/1996

OTHER PUBLICATIONS

M. Denais et al., "*On-the-fly* characterization of NBTI in ultra-thin gate oxide PMOSFET's", *Electron Devices Meeting, 2004. IEDM Technical Digest. IEEE International*. IEEE, pp. 109-112, Dec. 13-15, 2004.

(Continued)

*Primary Examiner* — Jermele M Hollington
*Assistant Examiner* — Douglas X Rodriguez
(74) *Attorney, Agent, or Firm* — Rabin & Berdo, P.C.

(57) ABSTRACT

A method of evaluating a semiconductor device having an insulated gate formed of a metal-oxide film semiconductor. The semiconductor device has a high potential side and a low potential side, and a threshold voltage that is a minimum voltage for forming a conducting path between the high and low potential sides. The method includes determining a variation of the threshold voltage at turn-on of the semiconductor device by continuously applying an alternating current (AC) voltage to the gate of the semiconductor device, a maximum voltage of the AC voltage being equal to or higher than the threshold voltage of the semiconductor device.

15 Claims, 6 Drawing Sheets

(51) Int. Cl.
    *H01L 29/16* (2006.01)
    *H01L 29/165* (2006.01)
    *H01L 29/20* (2006.01)
    *H01L 29/78* (2006.01)
    *H01L 29/10* (2006.01)

(52) U.S. Cl.
    CPC ........ *H01L 29/1602* (2013.01); *H01L 29/165* (2013.01); *H01L 29/1608* (2013.01); *H01L 29/2003* (2013.01); *H01L 29/7802* (2013.01); *H01L 29/1087* (2013.01)

(56) References Cited

U.S. PATENT DOCUMENTS

| | | | |
|---|---|---|---|
| 2015/0070045 A1* | 3/2015 | Fang | G01R 31/2621 324/762.01 |
| 2015/0109019 A1* | 4/2015 | Matsuda | H01L 29/4908 324/762.01 |

OTHER PUBLICATIONS

M. Sometani et al., "Exact Characterization of Threshold Voltage Instability in 4H-SiC MOSFETs by Non-relaxation Method", *Materials Science Forum*, vols. 821-823, Trans Tech Publications, pp. 685-688, Jun. 30, 2015.

\* cited by examiner

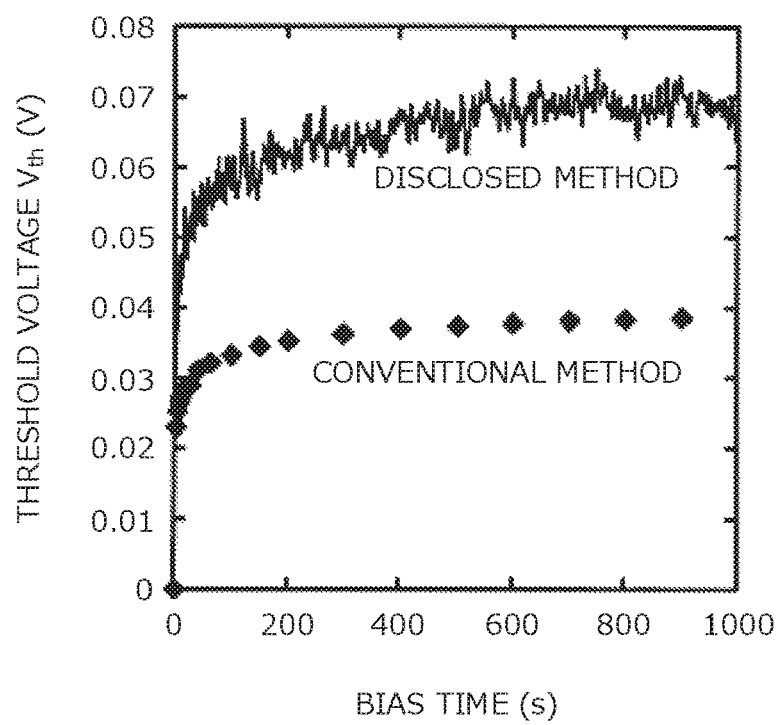
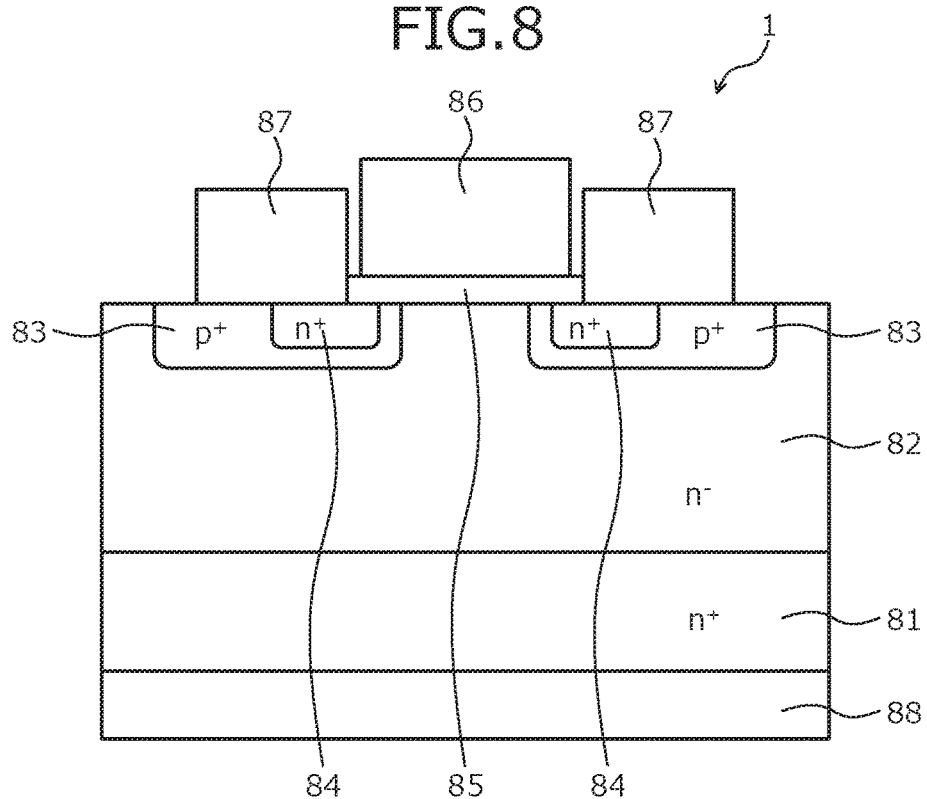

METHOD OF EVALUATING SEMICONDUCTOR DEVICE AND APPARATUS FOR EVALUATING SEMICONDUCTOR DEVICE

CROSS REFERENCE TO RELATED APPLICATIONS

This application is based upon and claims the benefit of priority of the prior Japanese Patent Application No. 2015-204678, filed on Oct. 16, 2015, the entire contents of which are incorporated herein by reference.

BACKGROUND OF THE INVENTION

1. Field of the Invention

The embodiments discussed herein are related to a method of evaluating a semiconductor device and an apparatus for evaluating a semiconductor device.

2. Description of the Related Art

In recent years, in metal oxide semiconductor field effect transistors (MOSFETs), variation of the threshold voltage at the time of turn-on consequent to the application of voltage to a gate has become a problem. Variation of the threshold voltage leads to problems such as unbalance of electric current flowing in the semiconductor device (the electric current is not balanced) and decreased current efficiency. Therefore, variation of the threshold voltage at the time of turn-on has to be suppressed and in order to suppress this variation, the threshold voltage at the time of turn-on has to be measured accurately.

Among conventional methods of measuring threshold voltage, one proposed method involves applying voltage (gate voltage) to a gate for an arbitrary period, and after application of the voltage to the gate is suspended, measuring the threshold voltage by measuring gate voltage dependence of the current flowing between a source and a drain to calculate the extent to which the threshold voltage varies (for example, see Denais, M., et al, "On-the-fly characterization of NBTI in ultra-thin gate oxide PMOSFET's", IEEE International Electron Devices Meeting (IEDM) 2004, p. 109-112).

According to another proposed method, alternating current (AC) voltage (gate voltage) such as voltage of a rectangular pulse is applied to a gate for an arbitrary period of time, and after application of the AC voltage to the gate is suspended, the threshold voltage is measured by measuring gate voltage dependence of the current flowing between a source and a drain whereby, the extent to which the threshold voltage varies is calculated (for example, see Japanese Patent Application Laid-Open Publication No. H8-5706).

Nonetheless, with the methods described above, the application of voltage to the gate and measurement of the threshold voltage after application of the voltage to the gate is suspended consume a certain amount of time. Therefore, a problem arises in that the impact of the application of the voltage to the gate relaxes during a period from the suspension of the application of the voltage to the gate until the measurement of the threshold voltage whereby, variation of the threshold voltage is underestimated.

Accordingly, a method of measuring the threshold voltage in a state where a constant voltage is continuously applied to a gate has been proposed (for example, see Sometani, Mitsuru, et al, "Exact Characterization of Threshold Voltage Instability in 4H-SiC MOSFETs by Non-relaxation method", Materials Science Forum, Vols. 821-823 (2015), pp. 685-688). FIG. 10 is a circuit diagram schematically depicting an apparatus for evaluating a semiconductor device according to a conventional technique described by Sometani, Mitsuru, et al.

The apparatus for evaluating a semiconductor device according to an embodiment depicted in FIG. 10 is an example of an evaluation device that measures variation of a threshold voltage $V_{th}$ of a MOSFET 11 to evaluate reliability of the MOSFET 11. The apparatus for evaluating a semiconductor device includes the MOSFET 11, which is an n-channel type, for example, and subject to measurement, and a constant-voltage source 12 and a constant-current source 13 that apply electrical stress to the MOSFET 11. A drain of the MOSFET 11 is connected to the constant-current source 13, with a source and body of the MOSFET 11 being grounded. A gate of the MOSFET 11 is connected to a positive terminal of the constant-voltage source 12. A negative terminal of the constant-voltage source 12 is grounded.

FIG. 11 is a characteristic diagram of the voltage applied to the gate of the MOSFET 11 by the constant-voltage source 12 according to the conventional technique. The constant-voltage source 12 has an electromotive force equal to or higher than the threshold voltage $V_{th}$ of the MOSFET 11, and continuously applies to the gate of the MOSFET 11, a constant gate voltage $V_g$ ($\geq V_{th}$) equal to or higher than the threshold voltage $V_{th}$ of the MOSFET 11. The amount of variation $\Delta V_{th}$ of the threshold voltage $V_{th}$ of the MOSFET 11 is found by converting the amount of variation of a source-drain voltage $V_{sd}$ of the MOSFET 11 measured in a state where a source-drain current $I_{sd}$ of the MOSFET 11 is maintained to be constant.

SUMMARY OF THE INVENTION

To solve the problems above, according to one aspect of the invention, a method of evaluating a semiconductor device having an insulated gate structure formed of a metal oxide film semiconductor includes determining variation of a threshold voltage at turn-on of the semiconductor device, while continuously applying to a gate of the semiconductor device, AC voltage having a maximum voltage equal to or higher than the threshold voltage of the semiconductor device.

In the method according, a minimum voltage of the AC voltage is less than the threshold voltage of the semiconductor device.

In the method according, in determining the variation: a constant voltage is applied between a high potential side and a low potential side of the semiconductor device while the AC voltage is continuously applied to the gate of the semiconductor device, a change of an electric current flowing from the high potential side to the low potential side of the semiconductor device corresponding to an application time of the AC voltage is measured, and the variation of the threshold voltage at turn-on of the semiconductor device is obtained based on the measured change of the electric current.

In the method, the constant voltage is set to be less than a difference of the maximum voltage and the threshold voltage.

In the method, the variation of the threshold voltage at turn-on of the semiconductor device is obtained, based on a product of the measured change of electric current multiplied by an inverse of a ratio of a time period during which a voltage equal to or higher than the threshold voltage of the semiconductor device is applied to an application time period of the AC voltage.

In the method, before the variation is determined, carrier mobility of the semiconductor and capacitance of the oxide film are set based on an electric current flowing in a direction from the high potential side toward the low potential side of the semiconductor device and a voltage applied to the gate of the semiconductor device.

According another aspect of the invention, a device for evaluating a semiconductor device having an insulated gate structure formed of a metal oxide film semiconductor includes a voltage source connected to a gate of the semiconductor device and applying to the gate of the semiconductor device, AC voltage having a maximum voltage equal to or higher than a threshold voltage of the semiconductor device. An extent to which the threshold voltage varies at turn-on of the semiconductor device is determined while the AC voltage is continuously applied to the gate of the semiconductor device by the voltage source.

In the device, a minimum voltage of the AC voltage is less than the threshold voltage of the semiconductor device.

The device further includes a constant-voltage source connected to a high potential side of the semiconductor device and applying a constant voltage between the high potential side and a low potential side of the semiconductor device. The constant voltage is applied to the semiconductor device by the constant-voltage source while the AC voltage is continuously applied to the gate of the semiconductor device by the voltage source. A change of an electric current flowing from the high potential side to the low potential side of the semiconductor device corresponding an application time period of the AC voltage is measured, and the extent to which the threshold voltage varies at turn-on of the semiconductor device is obtained based on the measured change of the electric current.

In the device, the constant voltage is set to be less than a difference of the maximum voltage and the threshold voltage.

In the device, the extent to which the threshold voltage varies at turn-on of the semiconductor device is obtained, based on a product of the measured change of the electric current multiplied by an inverse of a ratio of a time period during which a voltage that is equal to or higher than the threshold voltage of the semiconductor device is applied to an application time period of the AC voltage.

In the device, before application of the AC voltage to the gate of the semiconductor device, carrier mobility of the semiconductor and capacitance of the oxide film are set based on the electric current flowing in a direction from a high potential side toward a low potential side of the semiconductor device and a voltage applied to the gate of the semiconductor device.

In the device, the semiconductor device is configured using silicon as a semiconductor material.

In the device, the semiconductor device is configured using silicon carbide as a semiconductor material.

In the device, the semiconductor device is configured using germanium as a semiconductor material.

In the device, the semiconductor device is configured using silicon-germanium as a semiconductor material.

In the device, the semiconductor device is configured using gallium arsenic as a semiconductor material.

In the device, the semiconductor device is configured using gallium nitride as a semiconductor material.

In the device, the semiconductor device is configured using diamond as a semiconductor material.

The device further includes a storage device storing predetermined information. The extent to which the threshold voltage varies at turn-on of the semiconductor device is automatically measured by executing a program stored to the storage device in advance.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 7 is a characteristic diagram depicting temporal variation of threshold voltage $V_{th}$ measured using the method of evaluating a semiconductor device according to the present embodiment;

FIG. 8 is a sectional view depicting an example of a structure of a vertical double-diffused MOSFET subject to measurement by the apparatus for evaluating a semiconductor device according to the present embodiment;

DETAILED DESCRIPTION OF THE INVENTION

Figure 1:
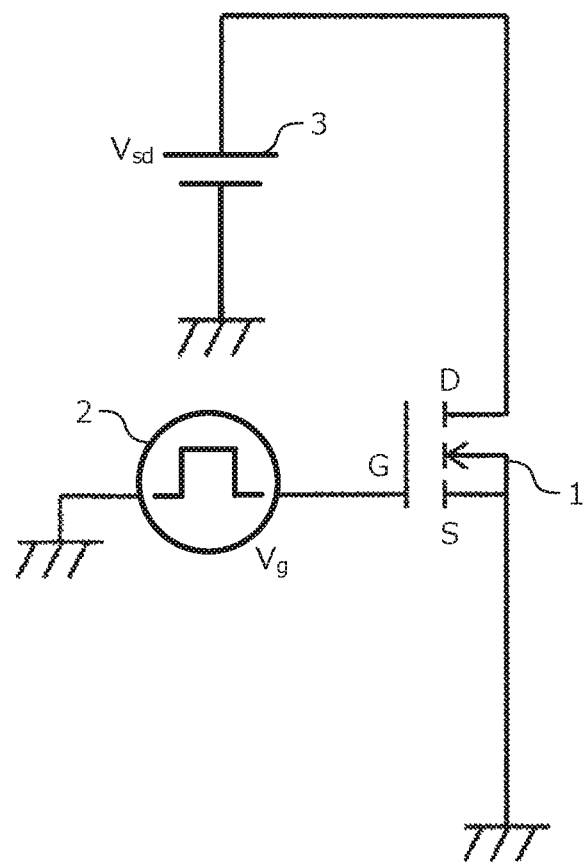
FIG. 1 is a circuit diagram schematically depicting an apparatus for evaluating a semiconductor device according to an embodiment.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

An apparatus for evaluating a semiconductor device according to an embodiment is described. FIG. 1 is a circuit diagram schematically depicting an apparatus for evaluating a semiconductor device according to the present embodiment. The apparatus for evaluating a semiconductor device depicted in FIG. 1 is an example of an evaluation device that measures the amount of variation of a threshold voltage $V_{th}$ of a MOSFET 1 to evaluate reliability of the MOSFET 1. The apparatus for evaluating a semiconductor device includes the MOSFET 1, which is an n-channel type, for example, and subject to measurement, and an AC voltage source 2 and a constant-voltage source 3 that apply electrical stress to the MOSFET 1. A drain of the MOSFET 1 is connected to the constant-voltage source 3, with a source and a body of the MOSFET 1 being grounded. A gate of the MOSFET 1 is connected to a positive terminal of the AC voltage source 2. A negative terminal of the AC voltage source 2 is grounded.

The AC voltage source 2 has an electromotive force equal to or higher than the threshold voltage $V_{th}$ of the MOSFET 1, and continuously applies to the gate of the MOSFET 1, an AC voltage (hereinafter, "stress voltage") $V_g$ such as that depicted in FIG. 2 and, for example, where the voltage changes periodically with time and the maximum voltage is equal to or higher than the threshold voltage $V_{th}$ of the MOSFET 1.

Figure 2:
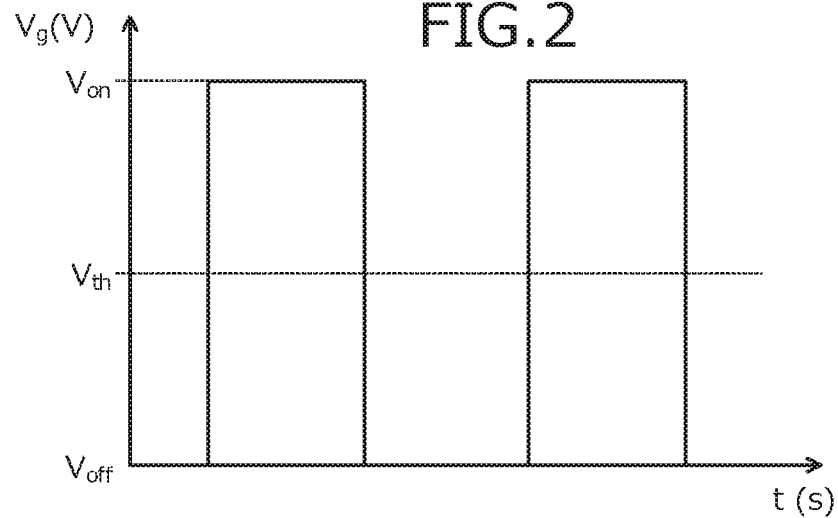
FIG. 2 is a characteristic diagram depicting temporal variation of voltage applied to a gate of a MOSFET 1 by an AC voltage source 2.

FIG. 2 is a characteristic diagram depicting temporal variation of the voltage applied to the gate of the MOSFET 1 by the AC voltage source 2. The AC voltage source 2 applies periodically to the gate of the MOSFET 1, a rectangular voltage having an ON voltage ($V_{on}$) equal to or higher than the threshold voltage $V_{th}$ for a certain ON time period and an OFF voltage ($V_{off}$) lower than the threshold voltage $V_{th}$ for a certain OFF time period and thereby, turns on/off the MOSFET 1 periodically. FIG. 2 depicts an example of application of a rectangular voltage. The voltage is not limited to a rectangular voltage. For example, the AC voltage source 2 may have a sine waveform having a maximum value equal to or higher than the threshold voltage $V_{th}$ and a minimum value lower than the threshold voltage $V_{th}$.

The constant-voltage source 3 applies a constant-voltage stress (source-drain voltage) $V_{sd}$ between the source and the drain of the MOSFET 1 continuously. Accordingly, when the ON voltage is applied to the gate of the MOSFET 1 by the AC voltage source 2, because the ON voltage is equal to or higher than the threshold voltage $V_{th}$, the MOSFET 1 is turned on and enters a state where source-drain current $I_{sd}$ of the MOSFET 1 flows. When the OFF voltage is applied to the gate of the MOSFET 1 by the AC voltage source 2, because the OFF voltage is lower than the threshold voltage $V_{th}$, the MOSFET 1 is turned off and enters a state where the source-drain current $I_{sd}$ of the MOSFET 1 does not flow.

The constant-voltage source 3 also functions as a current measurement unit, and when the constant source-drain voltage $V_{sd}$ is applied to the MOSFET 1, the constant-voltage source 3 continuously measures and monitors the source-drain current $I_{sd}$ flowing in the MOSFET 1. That is, the constant-voltage source 3 measures temporal variation of the source-drain current $I_{sd}$ flowing in the MOSFET 1, in a state where the source-drain voltage $V_{sd}$ of the MOSFET 1 is maintained to be constant. As the constant-voltage source 3, for example, a so-called source measurement unit (SMU) that supplies current or voltage to a subject to be measured and simultaneously measures the voltage applied to the subject or the current flowing in the subject can be used.

If the ON time period and the OFF time period of the AC voltage source 2 are set in units of microseconds (μs), the source measurement unit (SMU) attached to the apparatus for evaluating a semiconductor device cannot follow changes of the source-drain current $I_{sd}$ due to the change of the ON voltage and the OFF voltage. For example, the source-drain current $I_{sd}$ measured by the SMU becomes the average current for 1 millisecond, which can be followed by the SMU. For example, if the ratio between the ON time period and the OFF time period is respectively 50%, the source-drain current $I_{sd}$ becomes 50% of that as compared to when the constant voltage is applied. Therefore, by multiplying the source-drain current $I_{sd}$ by the inverse of the ratio of the ON time period to the voltage application time period (1/(ON time period/(ON time period+OFF time period))), a source-drain current $I^{on}_{sd}$ when only the ON voltage is continuously applied can be obtained.

For example, if the ratio between the ON time period and the OFF time period is respectively 50%, by multiplying the source-drain current $I_{sd}$ by the inverse of the ratio of the ON time period to the voltage application time period (1/(0.5/(0.5+0.5)))=2, the source-drain current $I^{on}_{sd}$ when only the ON voltage is continuously applied can be obtained.

An amount of variation $\Delta V_{th}$ of the threshold voltage $V_{th}$ of the MOSFET 1 is measured by the constant-voltage source 3, and can be found by converting the amount of variation of the source-drain current $I^{on}_{sd}$ of the MOSFET 1 converted for a case of continuous application of only the ON voltage. In particular, the amount of variation $\Delta V_{th}$ of the threshold voltage $V_{th}$ of the MOSFET 1 is calculated in the following manner. In a boundary condition in which the source-drain voltage $V_{sd}$ of the MOSFET 1 is sufficiently smaller than the difference of the ON voltage of the stress voltage $V_g$ supplied by the AC voltage source 2 minus the threshold voltage $V_{th}$ of the MOSFET 1 ($V_{sd} \ll$ ON voltage of $V_g - V_{th}$), the source-drain current $I_{sd}$ of the MOSFET 1 is expressed by equation (1).

$$I_{sd} = \frac{Z}{L}\mu_n C_{ox}(V_g - V_{th})V_{sd} \qquad (1)$$

Furthermore, equation (1) is converted into an equation for which the solution is the threshold voltage $V_{th}$ of the MOSFET 1. Based on this equation, equation (2) is obtained for converting the amount of variation of the source-drain current $I_{sd}$ of the MOSFET 1 from a time (t=0) when the source-drain voltage $V_{sd}$ is applied to the MOSFET 1 until a predetermined time t, into the amount of variation $\Delta V_{th}$ of the threshold voltage $V_{th}$ of the MOSFET 1. L represents a channel length (shortest distance between the source and drain), Z represents a channel width (width of a channel portion in a direction orthogonal to the channel length), $\mu_n$ represents carrier mobility, and $C_{ox}$ represents gate insulating film (oxide film) capacitance.

$$\Delta V_{th}(t) = \frac{I_{sd}(t) - I_{sd}(0)}{\frac{Z}{L}\mu_n C_{ox} V_{sd}} \qquad (2)$$

The $Z/L \times \mu_n \times C_{ox}$ in the above equation represents a factor required when the amount of variation of the source-drain current $I_{sd}$ is converted into the amount of variation $\Delta V_{th}$ of the threshold voltage $V_{th}$ (hereinafter, "conversion factor"). The source-drain current $I_{sd}$ of the MOSFET 1 has a substantially proportional relation with the stress voltage $V_g$ applied to the gate of the MOSFET 1 (hereinafter, "$I_{sd}$-$V_g$ characteristics"), and the conversion factor ($=Z/L \times \mu_n \times C_{ox}$) in expression (2) coincides with the slope of the $I_{sd}$-$V_g$ characteristics.

Therefore, by measuring the $I_{sd}$-$V_g$ characteristics before applying the constant voltage stress (the source-drain voltage $V_{sd}$ by the constant-voltage source 3) to the MOSFET 1 and by substituting the source-drain current $I^{on}_{sd}$ when only the ON voltage is continuously applied to the MOSFET 1 for the $I_{sd}$ in equation (2), the amount of variation $\Delta V_{th}$ of the threshold voltage $V_{th}$ of the MOSFET 1 can be estimated.

As described above, by converting the amount of variation of the source-drain current $I_{sd}$ measured by the constant-voltage source 3 into the source-drain current $I^{on}_{sd}$ when only the ON voltage is continuously applied to the MOSFET 1 and substituting the converted source-drain current $I^{on}_{sd}$ for the $I_{sd}$ in equation (2), the amount of variation $\Delta V_{th}$ of the threshold voltage $V_{th}$ of the MOSFET 1 can be estimated.

Figure 3:
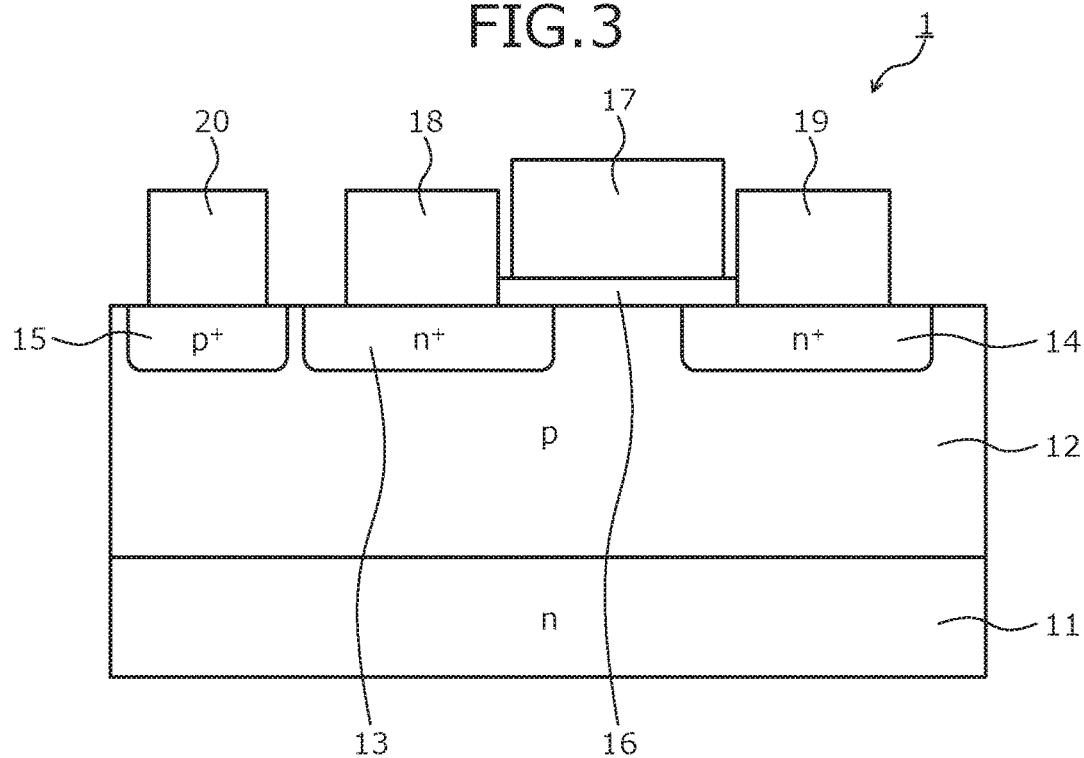
FIG. 3 is a cross-sectional view depicting an example of a structure of a MOSFET, which is subject to measurement by the apparatus for evaluating a semiconductor device according to the present embodiment.

An example of a structure of the MOSFET 1 in which the extent of variation of the threshold voltage $V_{th}$ is evaluated by the apparatus for evaluating a semiconductor device according to the present embodiment is described. FIG. 3 is a cross-sectional view depicting an example of the structure of the MOSFET, which is subject to measurement by the apparatus for evaluating a semiconductor device according to the present embodiment. In FIG. 3, a lateral MOSFET is depicted as an example of the structure of the MOSFET 1.

In the MOSFET 1 depicted in FIG. 3, a p-type epitaxial layer 12 being a p-type body region is provided on an n-type semiconductor substrate 11. An $n^+$-type source region 13, an $n^+$-type drain region 14, and a $p^+$-type body contact region 15 are each provided selectively on a surface layer of the p-type epitaxial layer 12, on an opposite side of the p-type epitaxial layer 12 with respect to an n-type semiconductor substrate 11 side of the p-type epitaxial layer 12.

On the surface of a portion of the p-type epitaxial layer 12 between the $n^+$-type source region 13 and the $n^+$-type drain region 14, a gate electrode 17 is provided via a gate insulating film 16. A source electrode 18 contacts the $n^+$-type source region 13. A drain electrode 19 contacts the $n^+$-type drain region 14. A body electrode 20 contacts the $p^+$-type body contact region 15. The source electrode 18 and the body electrode 20 are grounded.

Although not particularly limited hereto, for example, dimensions and impurity concentrations of respective parts of the MOSFET 1 may have the following values. The resistivity and the thickness of the n-type semiconductor substrate 11 are 0.02 Ωcm and 350 μm, respectively. The impurity concentration and the thickness of the p-type epitaxial layer 12 are $5\times10^{15}$/cm$^3$ and 5 μm, respectively. The impurity concentration and the thickness of the $n^+$-type source region 13 are $2\times10^{20}$/cm$^3$ and 0.3 μm, respectively. The impurity concentration and the thickness of the $n^+$-type drain region 14 are $2\times10^{20}$/cm$^3$ and 0.3 μm, respectively. The impurity concentration and the thickness of the $p^+$-type body contact region 15 are $2\times10^{20}$/cm$^3$ and 0.3 μm, respectively. The gate insulating film 16 formed of an oxide film (SiO$_2$) having a thickness 50 nm.

Figure 4:
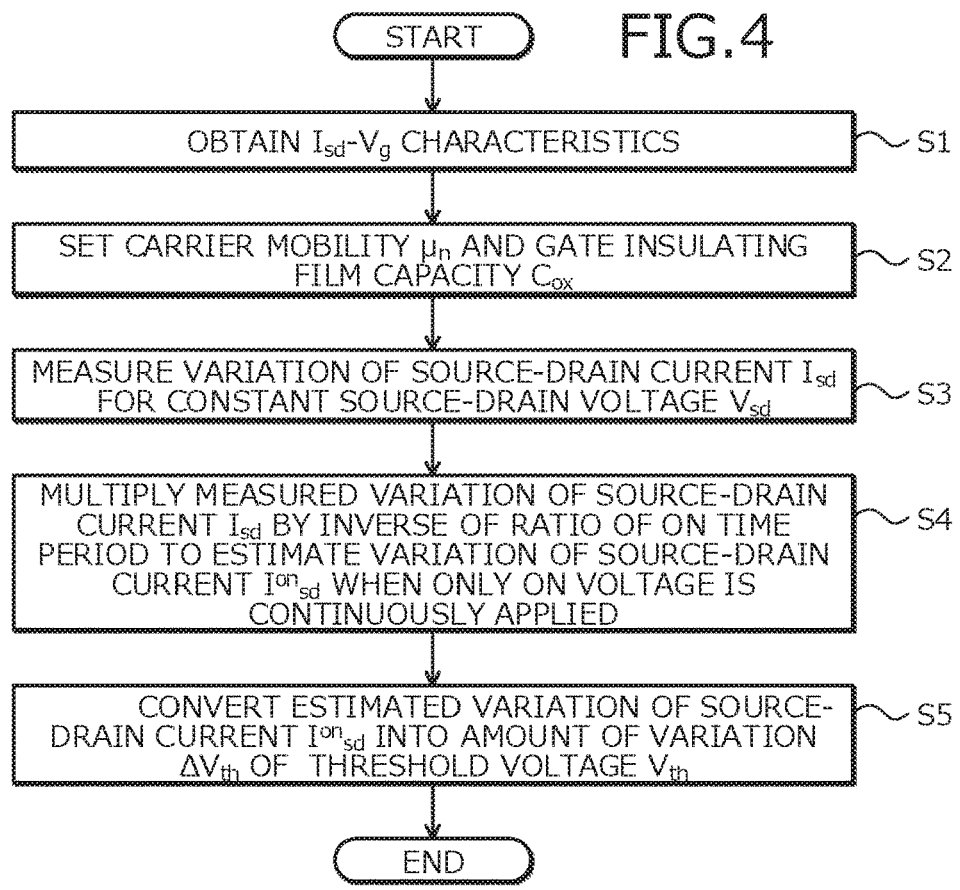
FIG. 4 is a flowchart depicting an outline of a method of evaluating a semiconductor device according to the present embodiment.

The method of evaluating a semiconductor device according to the present embodiment is described taking as an example, a case where the variation degree of the threshold voltage $V_{th}$ of the MOSFET 1 prepared under the conditions exemplified above is evaluated. FIG. 4 is a flowchart depicting an outline of the method of evaluating a semiconductor device according to the present embodiment.

The source and the body of the MOSFET 1 are grounded first, and the source-drain current $I_{sd}$ of the MOSFET 1 is measured by sweeping (changing) the gate voltage of the MOSFET 1 in a range from 0 volt to 15 volts, in a state where the source-drain voltage $V_{sd}$ is set to a constant voltage of 0.1 volt, whereby the $I_{sd}$-$V_g$ characteristics of the MOSFET 1 are obtained (step S1).

Figure 5:
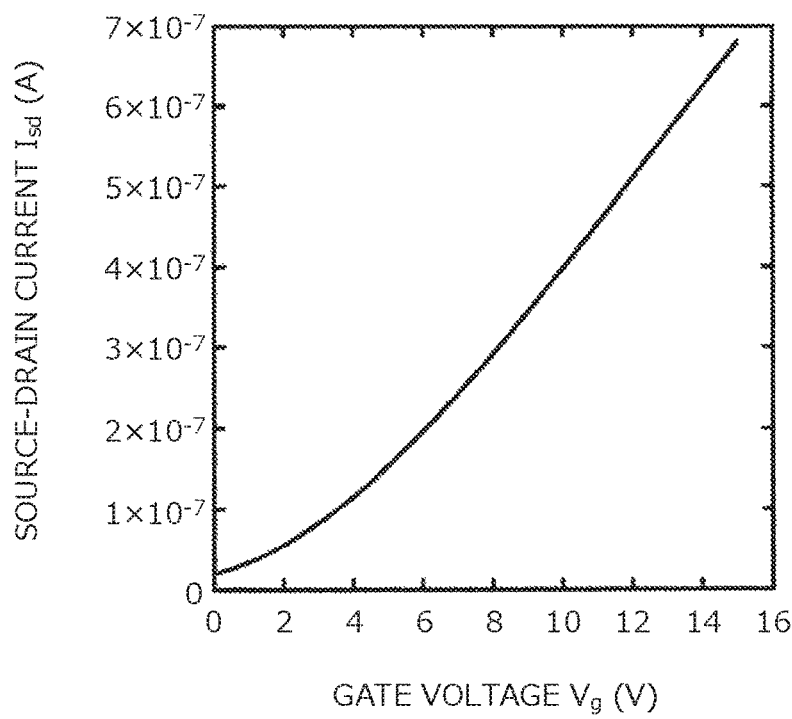
FIG. 5 is a characteristic diagram depicting source-drain current $I_{sd}$-gate voltage $V_g$ characteristics measured by the method of evaluating a semiconductor device according to the present embodiment.

The $I_{sd}$-$V_g$ characteristics of the MOSFET 1 at step S1 when the maximum value of the gate voltage $V_g$ to be applied to the MOSFET 1 is set to a range from the threshold voltage $V_{th}$ of the MOSFET 1 (=4 volts) to the ON voltage of the AC voltage source 2 (=15 volts) are depicted in FIG. 5. FIG. 5 is a characteristic diagram depicting the source-drain current $I_{sd}$-gate voltage $V_g$ characteristics measured by the method of evaluating a semiconductor device according to the present embodiment.

The carrier mobility $\mu_n$ and the gate insulating film capacity $C_{ox}$ of the MOSFET 1 are set based on the $I_{sd}$-$V_g$ characteristics of the MOSFET 1 obtained at step S1 (step S2). In particular, the slope ($=Z/L\times\mu_n\times C_{ox}$) of the $I_{sd}$-$V_g$ characteristics of the MOSFET 1, which is subject to measurement, is set based on the $I_{sd}$-$V_g$ characteristics for a gate voltage $V_g$ by which the $I_{sd}$-$V_g$ characteristics have a proportional relation (a straight line), and higher.

With respect to the $I_{sd}$-$V_g$ characteristics depicted in FIG. 5, the $I_{sd}$-$V_g$ characteristics have a substantially proportional relation at a gate voltage $V_g$ of 8 volts and higher. Therefore, the carrier mobility $\mu_n$ and the gate insulating film capacity $C_{ox}$ of the MOSFET 1, that is, the conversion factor ($=Z/L\times\mu_n\times C_{ox}=5.6\times10^{-8}$ A/V) in equation (2) is set, based on a portion of the $I_{sd}$-$V_g$ characteristics for gate voltages $V_g$ of 8 volts and higher.

The source and the body of the MOSFET 1 are then grounded, and a constant voltage (the source-drain voltage $V_{sd}$) of, for example, 0.1 volt is applied between the source and the drain of the MOSFET 1 by the constant-voltage source 3, in a state with the rectangular stress voltage $V_g$ having the ON voltage of 15 volts, the ON time period of 10 μs, the OFF voltage of 0 volt, and the OFF time period of 10 μs, being applied to the gate of the MOSFET 1 by the AC voltage source 2. The amount of variation of the source-drain current $I_{sd}$ flowing between the source and the drain of the MOSFET 1 is then measured (step S3).

Figure 6:
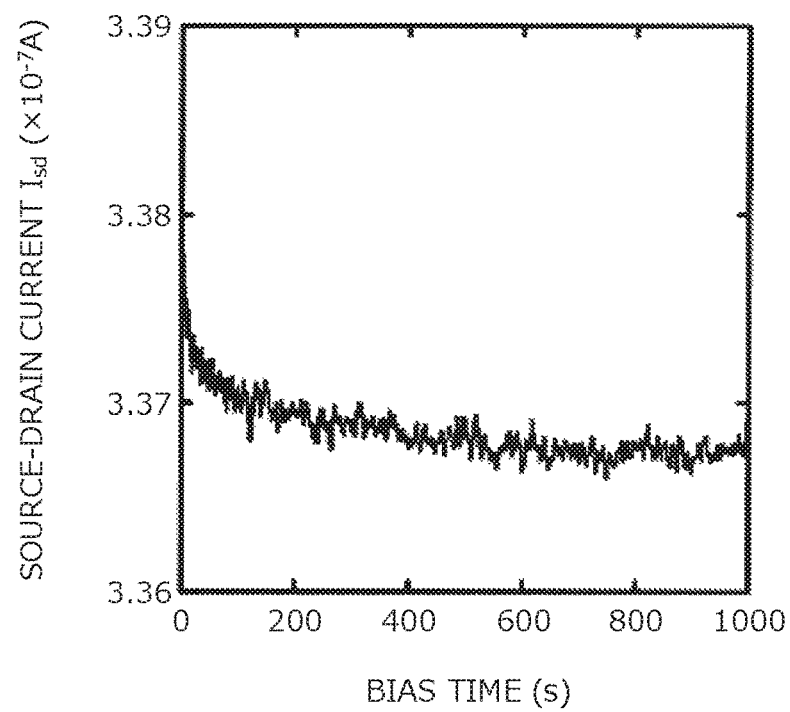
FIG. 6 is a characteristic diagram depicting temporal variation of a source-drain current $I_{sd}$ measured by the method of evaluating a semiconductor device according to the present embodiment.

FIG. 6 depicts temporal variation of the source-drain current $I_{sd}$ measured at step S3, with respect to application time (bias time) of the stress voltage $V_g$. FIG. 6 is a characteristic diagram depicting temporal variation of the source-drain current $I_{sd}$ measured by the method of evaluating a semiconductor device according to the present embodiment. As depicted in FIG. 6, the source-drain current $I_{sd}$ varies as the application time of the stress voltage $V_g$ increases.

By multiplying the amount of variation of the source-drain current $I_{sd}$ measured at step S3 by the inverse of the ratio of the ON time period to a voltage application time period (1/(ON time period/(ON time period+OFF time period))), the amount of variation of the source-drain current $I^{on}_{sd}$ when only the ON voltage is continuously applied to the MOSFET 1 can be estimated (step S4).

Under the above conditions, by multiplying the amount of variation of the source-drain current $I_{sd}$ measured at step S3 by 1/(10 μs/(10 μs+10 μs))=2, the amount of variation of the source-drain current $I^{on}_{sd}$ when only the ON voltage is continuously applied to the MOSFET 1 can be estimated.

By converting the amount of variation of the source-drain current $I^{on}_{sd}$ estimated at step S4 into the amount of variation $\Delta V_{th}$ of the threshold voltage $V_{th}$, based on the conversion factor ($=Z/L\times\mu_n\times C_{ox}=5.6\times10^{-8}$ A/V) set at step S2 and the above expression (2) (step S5), evaluation of reliability of the MOSFET 1 is complete.

Thereafter, measures for suppressing variations of the threshold voltage at the time of turn-on of the MOSFET 1 are taken with respect to the MOSFET 1 and circuit units near the MOSFET 1, based on the amount of variation $\Delta V_{th}$ of the threshold voltage $V_{th}$ obtained at step S5. An example of the measures taken may be increasing the H$_2$ concentration when post oxidation anneal (POA) treatment is performed after formation of an oxide film or extending the annealing time to suppress variations.

As an example, the amount of variation $\Delta V_{th}$ of the threshold voltage $V_{th}$ when the source-drain current $I_{sd}$ has varied from $3.3868 \times 10^{-7}$ amperes to $3.3679 \times 10^{-7}$ amperes is 0.0674 volt. The method of evaluating a semiconductor device according to the embodiment described above is carried out, for example, by using the apparatus for evaluating a semiconductor device according to the embodiment depicted in FIG. 1.

The temporal variation of the threshold voltage $V_{th}$ of the MOSFET 1 measured using the method of evaluating a semiconductor device according to the present embodiment is described next. FIG. 7 is a characteristic diagram depicting temporal variation of the threshold voltage $V_{th}$ measured using the method of evaluating a semiconductor device according to the present embodiment. FIG. 7 depicts the temporal variation of the threshold voltage $V_{th}$ of the MOSFET 1 measured using the method of evaluating a semiconductor device according to the present embodiment (hereinafter, "disclosed evaluation method"). FIG. 7 also depicts the temporal variation of the threshold voltage $V_{th}$ of the MOSFET 1 measured using, for example, the method of Denais, M., et al described above (hereinafter, "conventional evaluation method") for comparison.

The results depicted in FIG. 7 confirm that the measurement values of the threshold voltage $V_{th}$ according to the disclosed evaluation method are greater than the measurement values of the threshold voltage $V_{th}$ according to the conventional evaluation method. The reason thereof is as follows. In the conventional evaluation method, because the threshold voltage $V_{th}$ of the MOSFET 1 is measured after suspension of the application of the gate voltage to the MOSFET 1, the variation of the threshold voltage $V_{th}$ relaxes in a period from the application of the gate voltage to the MOSFET 1 until the measurement of the threshold voltage $V_{th}$, and the value of the threshold voltage $V_{th}$ is underestimated.

On the other hand, in the disclosed evaluation method, because the stress voltage $V_g$ is continuously applied to the gate of the MOSFET 1, the variation of the threshold voltage $V_{th}$ can be accurately measured without relaxation of the threshold voltage $V_{th}$.

Figure 9:
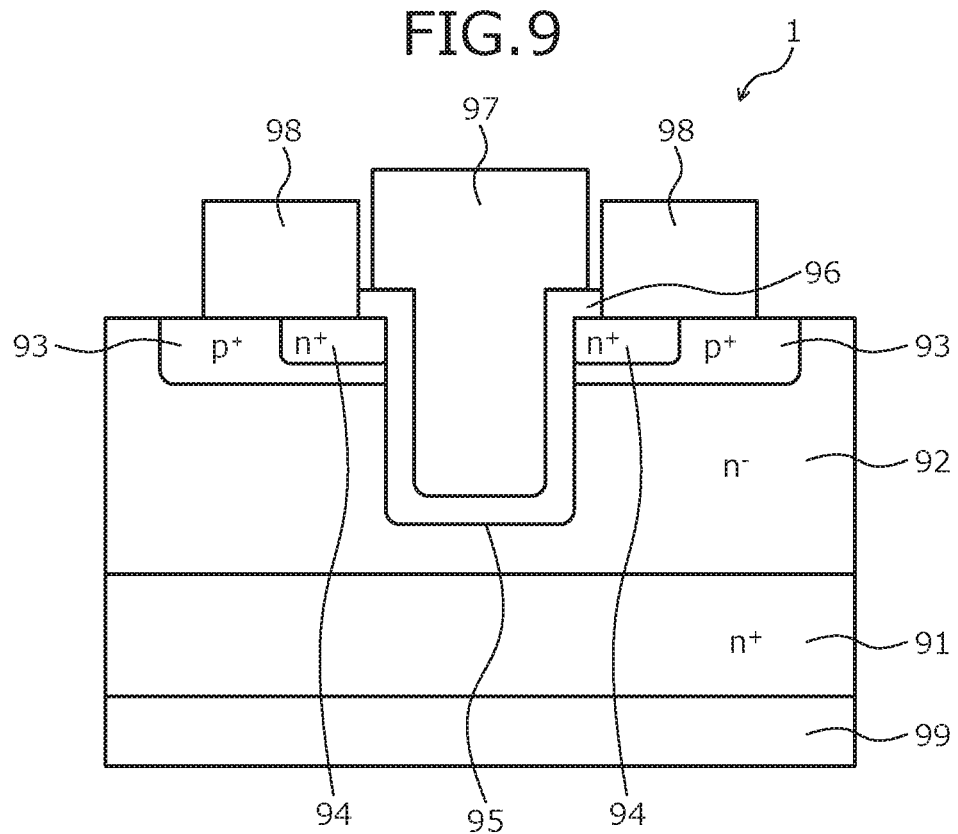
FIG. 9 is a sectional view depicting an example of a structure of a vertical trench MOSFET subject to measurement by the apparatus for evaluating a semiconductor device according to the present embodiment.
Figure 10:
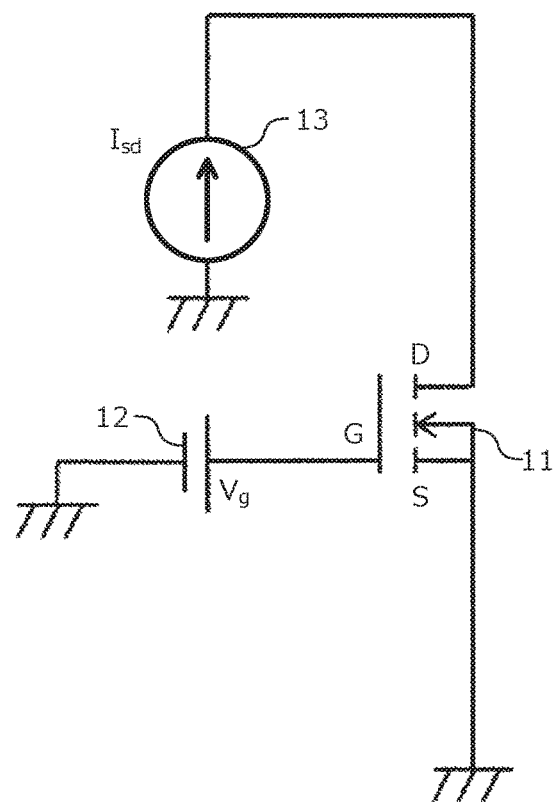
FIG. 10 is a circuit diagram schematically depicting an apparatus for evaluating a semiconductor device according to a conventional technique.
Figure 11:
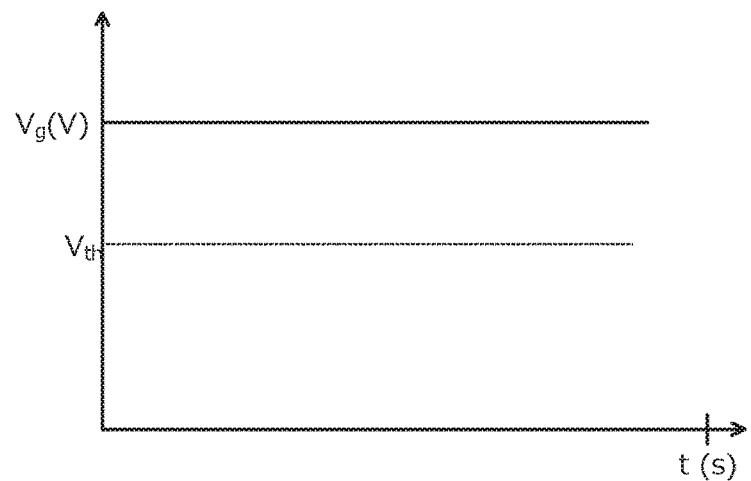
FIG. 11 is a characteristic diagram of a voltage applied to a gate of a MOSFET 11 by a constant-voltage source 12 according to a conventional technique.

Although the lateral MOSFET depicted in FIG. 3 is described in the embodiment, the method of evaluating a semiconductor device according to the present invention is applicable to, for example, a vertical double-diffused MOSFET (DMOSFET) depicted in FIG. 8 and a vertical trench MOSFET depicted in FIG. 9.

FIG. 8 is a sectional view depicting an example of a structure of a vertical double-diffused MOSFET subject to measurement by the apparatus for evaluating a semiconductor device according to the present embodiment. In the vertical double-diffused MOSFET depicted in FIG. 8, an n$^-$-type epitaxial layer 82 being an n$^-$-type drift region is provided on a surface of an n$^+$-type semiconductor substrate 81 being an n$^+$-type drain region. Two p$^+$-type regions 83 that are p$^+$-type base regions are selectively provided away from each other on a surface layer of the n$^-$-type epitaxial layer 82, on an opposite side of the n$^-$-type epitaxial layer 82 with respect to an n$^+$-type semiconductor substrate 81 side of the n$^-$-type epitaxial layer 82.

N$^+$-type regions 84 being n$^+$-type source regions are selectively provided on a surface layer on an opposite side with respect to an n$^+$-type semiconductor substrate 81 side of the two p$^+$-type regions 83. A gate electrode 86 is provided via a gate insulating film 85 on the surface of a portion the n$^-$-type epitaxial layer 82 between the two p$^+$-type regions 83. Source electrodes 87 contact the p$^+$-type region 83 and the n$^+$-type region 84. A drain electrode 88 is provided on a back surface of the n$^+$-type semiconductor substrate 81.

Although not particularly limited hereto, for example, dimensions and impurity concentrations of respective parts of the vertical double-diffused MOSFET 1 may have the following values. The resistivity and the thickness of the n$^+$-type semiconductor substrate 81 are 0.02 Ωcm and 350 μm, respectively. The impurity concentration and the thickness of the n$^-$-type epitaxial layer 82 are $5 \times 10^{16}$/cm$^3$ and 10 μm, respectively. The impurity concentration and the thickness of the p$^+$-type region 83 are $2 \times 10^{17}$/cm$^3$ and 0.5 μm, respectively. The impurity concentration and the thickness of the n$^+$-type region 84 are $2 \times 10^{20}$/cm$^3$ and 0.3 μm, respectively. The gate insulating film 85 formed of an oxide film (SiO$_2$) having a thickness of 50 nm.

FIG. 9 is a sectional view depicting an example of a structure of the vertical trench MOSFET that is subject to measurement by the apparatus for evaluating a semiconductor device according to the present embodiment. In the vertical trench MOSFET depicted in FIG. 9, an n$^-$-type epitaxial layer 92 being an n$^-$-type drift region is provided on a surface of an n$^+$-type semiconductor substrate 91 being an n$^+$-type drain region. P$^+$-type regions 93 being p$^+$-type base regions are selectively provided on a surface layer of the n$^-$-type epitaxial layer 92, on an opposite side of the n$^-$-type epitaxial layer 92 with respect to an n$^+$-type semiconductor substrate 91 side of the n$^-$-type epitaxial layer 92. N$^+$-type regions 94 being n$^+$-type source regions are selectively provided on a surface layer on an opposite side with respect to an n$^+$-type semiconductor substrate 91 side of the p$^+$-type regions 93. A trench structure is formed in the n$^+$-type semiconductor substrate 91, on the side where the n$^-$-type epitaxial layer 92 is provided.

A trench 95 penetrates the n$^+$-type region 94 and the p$^+$-type region 93 from the surface of the opposite side of the n$^-$-type epitaxial layer 92 with respect to the n$^+$-type semiconductor substrate 91 side and reaches the n$^-$-type epitaxial layer 92. A gate insulating film 96 is formed on the bottom and the side wall of the trench 95 along an inner wall of the trench 95, and a gate electrode 97 is formed on a side of the gate insulating film 96 in the trench 95. A source electrode 98 contacts the p$^+$-type region 93 and the n$^+$-type region 94. A drain electrode 99 is provided on a back surface of the n$^+$-type semiconductor substrate 91.

Although not particularly limited hereto, for example, dimensions and impurity concentrations of respective parts of the vertical trench MOSFET take the following values. The resistivity and the thickness of the n$^+$-type semiconductor substrate 91 are 0.02 Ωcm and 350 μm, respectively. The impurity concentration and the thickness of the n$^-$-type epitaxial layer 92 are $5 \times 10^{16}$/cm$^3$ and 10 μm, respectively. The impurity concentration and the thickness of the p$^+$-type region 93 are $2 \times 10^{17}$/cm$^3$ and 0.5 μm, respectively. The impurity concentration and the thickness of the n$^+$-type region 94 are $2 \times 10^{20}$/cm$^3$ and 0.3 μm, respectively. The gate insulating film 96 formed of an oxide film (SiO$_2$) having a thickness of 50 nm.

In the method of evaluating a semiconductor device according to the present invention, processes at respective steps can be performed automatically by executing a prepared program on a computer such as a personal computer or a workstation. The program is recorded on a computer-readable recording medium such as a solid state drive (SSD), a hard disk, a flexible disk, a CD-ROM, an MO, or a DVD and is read from the recording medium and executed by the computer. The program is a transmission medium that may be distributed via a network such as the Internet.

As described above, according to the present embodiment, by multiplying the inverse of the ratio of an ON time period to a voltage application time period and the amount of variation of a source-drain current measured by applying a constant-voltage stress to the drain of the MOSFET with an AC voltage being continuously applied to the gate of the MOSFET, the amount of variation of the source-drain current when only the ON voltage is continuously applied can be estimated. By calculating the amount of variation of the threshold voltage based on the amount of variation of the estimated source-drain current, the source-drain current when only the ON voltage is continuously applied can be calculated.

Therefore, even if AC voltage is applied to the gate, the amount of variation of the source-drain voltage of the MOSFET can be measured in a state where relaxation of the threshold voltage does not occur at all, and the extent of temporal variation of the threshold voltage can be accurately evaluated based on the measurement value, without underestimation. Accordingly, unbalance of current flowing in the semiconductor device (the current is not balanced) and decreased current efficiency can be suppressed.

The present invention is not limited to the embodiment described above, and various changes can be made without departing from the scope of the present invention. For example, in the embodiment described above, a case of using a constant-voltage source having a function of supplying AC current to a subject to be measured and a function of measuring current applied to the subject has been described. However, the present invention is not limited thereto, and the constant-voltage source may perform only application of a constant voltage to the subject to be measured and a current measurement unit that measures the current applied to the subject may be newly provided.

In the embodiment described above, the amount of variation of the threshold voltage is calculated based on the amount of variation of the source-drain current. However, the present invention is not limited thereto, and the source-drain voltage may be measured by using, for example, a source measurement unit in a state where the source-drain current of a MOSFET is maintained to be constant, to calculate the amount of variation of the threshold voltage based on the amount of variation of the source-drain voltage.

The present invention is applicable to a semiconductor device in which silicon (Si), silicon carbide (SiC), germanium (Ge), silicon-germanium (Site), gallium arsenic (GaAs), gallium nitride (GaN), or diamond (C) is used as a semiconductor material. Further, in the embodiment described above, the MOSFET has been described as a subject to be measured as an example. However, the present invention is not limited to the embodiment described above, and a semiconductor device of various structures including a MOS gate (insulated gate formed with a metal-oxide film semiconductor) structure can be set as a subject to be measured. The present invention is further applicable when the conductivity type of respective regions of the semiconductor device subject to measurement is reversed.

However, when the conventional MOSFET 11 is used as a power device, the voltage applied to the gate is not always a constant voltage, and AC voltage of, for example, a rectangular pulse may be applied. According to the method of Sometani, Mitsuru, et al, by continuously applying a constant voltage to the gate, the impact of relaxation of the threshold voltage variation on the measurement of the threshold voltage can be eliminated. However, according to the method of Sometani, Mitsuru, et al, if AC voltage of, for example, a rectangular pulse is applied, the impact of relaxation of the threshold voltage variation on the measurement of the threshold voltage becomes difficult to eliminate. According to the method of Denais, M., et al, the threshold voltage is measured after application of the AC voltage to the gate is suspended. Therefore, the impact of application of the voltage to the gate is relaxed, and the variation of the threshold voltage is underestimated.

According to the method of evaluating a semiconductor device and the apparatus for evaluating a semiconductor device of the present invention, the extent to which threshold voltage varies can be evaluated by applying stress voltage to a gate of a semiconductor device while applying AC voltage thereto. Therefore, even if AC voltage is applied to the gate, the amount of variation of the voltage applied between a high potential side and a low potential side of the semiconductor device can be measured in a state where relaxation of the threshold voltage does not occur at all, and the threshold voltage at the time of turn-on can be accurately measured based on the measurement value. Accordingly, the extent of temporal variation of the threshold voltage can be accurately evaluated and thus, unbalance of current flowing in the semiconductor device and decreased current efficiency can be suppressed.

As described above, the method of evaluating a semiconductor device and the apparatus for evaluating a semiconductor device according to the present invention are useful for characteristic evaluation of a semiconductor device, and are particularly suitable for evaluating the extent of variation of the threshold voltage at the time of turn-on due to the application of gate voltage.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of evaluating a semiconductor device having an insulated gate formed of a metal-oxide film semiconductor, the semiconductor device having a high potential side and a low potential side, and a threshold voltage that is a minimum voltage for forming a conducting path between the high and low potential sides, the method comprising:
   determining a variation of the threshold voltage at turn-on of the semiconductor device by continuously applying an alternating current (AC) voltage to the gate of the semiconductor device, including
      applying a constant voltage between the high potential side and the low potential side of the semiconductor device while continuously applying the AC voltage to the gate of the semiconductor device,
      measuring a change of an electric current flowing from the high potential side to the low potential side of the semiconductor device in a time period during which the AC voltage is applied, and
      obtaining the variation of the threshold voltage at the turn-on of the semiconductor device using the measured change of the electric current, a maximum voltage of the AC voltage being equal to or higher than the threshold voltage of the semiconductor device, a minimum voltage of the AC voltage being less than the threshold voltage of the semiconductor device, and the constant voltage being set less than a difference between the maximum voltage of the AC voltage and the threshold voltage.

2. The method according to claim 1, further comprising, before determining the variation, applying a voltage to the gate of the semiconductor device, and measuring an electric current flowing from the high potential side to the low potential side of the semiconductor device, and setting carrier mobility of the semiconductor device and capacitance of an oxide film in the gate of the semiconductor device based on the measured electric current and the voltage applied to the gate of the semiconductor device.

3. A method of evaluating a semiconductor device having an insulated gate formed of a metal-oxide film semiconductor, the semiconductor device having a high potential side and a low potential side, and a threshold voltage that is a minimum voltage for forming a conducting path between the high and low potential sides, the method comprising:

determining a variation of the threshold voltage at turn-on of the semiconductor device by continuously applying an alternating current (AC) voltage to the gate of the semiconductor device, including applying a constant voltage between the high potential side and the low potential side of the semiconductor device while continuously applying the AC voltage to the gate of the semiconductor device, measuring a change of an electric current flowing from the high potential side to the low potential side of the semiconductor device in a time period during which the AC voltage is applied, and obtaining the variation of the threshold voltage at the turn-on of the semiconductor device using the measured change of the electric current, a maximum voltage of the AC voltage being equal to or higher than the threshold voltage of the semiconductor device, a minimum voltage of the AC voltage being less than the threshold voltage of the semiconductor device, wherein the obtaining the variation of the threshold voltage includes obtaining the variation of the threshold voltage based on a product of the measured change of electric current and an inverse of an ON time ratio, the ON time ratio being a ratio of an ON time period, during which the applied AC voltage is equal to or higher than the threshold voltage of the semiconductor device, to the time period during which the AC voltage is applied.

4. A device for evaluating a semiconductor device having an insulated gate formed of a metal-oxide film semiconductor, the semiconductor device having a high potential side and a low potential side, and a threshold voltage that is a minimum voltage for forming a conducting path between the high and low potential sides, the device comprising:

a voltage source connected to the gate of the semiconductor device, the voltage source being configured to continuously apply an alternating current (AC) voltage, a maximum voltage of which is equal to or higher than the threshold voltage of the semiconductor device, to the gate of the semiconductor device at turn-on of the semiconductor device, so as to determine a variation of the threshold voltage at the turn-on of the semiconductor device, and a constant-voltage source connected to the high potential side of the semiconductor device, the constant-voltage source being configured to apply a constant voltage between the high and low potential sides of the semiconductor device while the voltage source continuously applies the AC voltage to the gate of the semiconductor device, and to measure a change of an electric current flowing from the high potential side to the low potential side of the semiconductor device in a time period during which the AC voltage is applied, so that the variation of the threshold voltage is determinable using the measured change of the electric current, wherein the constant-voltage source is configured to supply, as the constant voltage, a voltage less than a difference between the maximum voltage of the AC voltage and the threshold voltage.

5. The device according to claim 4, wherein a minimum voltage of the AC voltage is less than the threshold voltage of the semiconductor device.

6. The device according to claim 4, wherein the variation of the threshold voltage at the turn-on of the semiconductor device is obtainable using a product of the measured change of the electric current and an inverse of a ON time ratio, the ON time ratio being a ratio of a ON time period, during which the applied AC voltage is equal to or higher than the threshold voltage of the semiconductor device, to the time period during which the AC voltage is applied.

7. The device according to claim 4, wherein before application of the AC voltage to the gate of the semiconductor device, carrier mobility of the semiconductor device and capacitance of an oxide film in the gate of the semiconductor device are set based on an electric current flowing from the high potential side toward the low potential side of the semiconductor device and a voltage applied to the gate of the semiconductor device.

8. The device according to claim 4, wherein the semiconductor device uses silicon as a semiconductor material thereof.

9. The device according to claim 4, wherein the semiconductor device uses silicon carbide as a semiconductor material thereof.

10. The device according to claim 4, wherein the semiconductor device uses germanium as a semiconductor material thereof.

11. The device according to claim 4, wherein the semiconductor device uses silicon-germanium as a semiconductor material thereof.

12. The device according to claim 4, wherein the semiconductor device uses gallium arsenic as a semiconductor material thereof.

13. The device according to claim 4, wherein the semiconductor device uses gallium nitride as a semiconductor material thereof.

14. The device according to claim 4, wherein the semiconductor device uses diamond as a semiconductor material thereof.

15. The device according to claim 4, further comprising a storage device storing program instructions, execution of which by a processor causes the variation of the threshold voltage at turn-on of the semiconductor device to be automatically determined.

* * * * *